(12) United States Patent
Byl et al.

(10) Patent No.: US 11,299,802 B2
(45) Date of Patent: Apr. 12, 2022

(54) GERMANIUM TETRAFLOURIDE AND HYDROGEN MIXTURES FOR AN ION IMPLANTATION SYSTEM

(71) Applicant: ENTEGRIS, INC., Billerica, MA (US)

(72) Inventors: Oleg Byl, Southbury, CT (US); Ying Tang, Brookfield, CT (US); Joseph R. Despres, Middletown, CT (US); Joseph Sweeney, New Milford, CT (US); Sharad N. Yedave, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/055,885

(22) PCT Filed: Mar. 15, 2019

(86) PCT No.: PCT/US2019/022516
§ 371 (c)(1),
(2) Date: Nov. 16, 2020

(87) PCT Pub. No.: WO2019/221812
PCT Pub. Date: Nov. 21, 2019

(65) Prior Publication Data
US 2021/0189550 A1    Jun. 24, 2021

Related U.S. Application Data

(60) Provisional application No. 62/672,879, filed on May 17, 2018.

(51) Int. Cl.
*C23C 14/48*    (2006.01)
*C23C 14/56*    (2006.01)
(Continued)

(52) U.S. Cl.
CPC ............ *C23C 14/48* (2013.01); *C23C 14/564* (2013.01); *H01J 37/08* (2013.01); *H01J 37/3171* (2013.01);
(Continued)

(58) Field of Classification Search
CPC ........ C23C 14/48; C23C 14/564; H01J 37/08; H01J 37/3171; H01J 2237/006; H01J 2237/022
See application file for complete search history.

(56) References Cited

U.S. PATENT DOCUMENTS

2010/0176306 A1  7/2010 Lin et al.
2012/0058252 A1  3/2012 Sweeney et al.
(Continued)

FOREIGN PATENT DOCUMENTS

KR    20140127135 A    11/2014

OTHER PUBLICATIONS

Chambers, B. et al.; Germanium Ion Implantation Efficiency Improvement with Use of Germanium Tetrafluoride; Entegris, 2014.

*Primary Examiner* — Nicole M Ippolito
*Assistant Examiner* — Hanway Chang
(74) *Attorney, Agent, or Firm* — Entegris, Inc.

(57) ABSTRACT

The current disclosure is directed to methods and assemblies configured to deliver a mixture of germanium tetrafluoride ($GeF_4$) and hydrogen ($H_2$) gases to an ion implantation apparatus, so $H_2$ is present in an amount in the range of 25%-67% (volume) of the gas mixture, or the $GeF_4$ and $H_2$ are present in a volume ratio ($GeF_4:H_2$) in the range of 3:1 to 33:67. The use of the $H_2$ gas in an amount in mixture or relative to the $GeF_4$ gas prevents the volatilization of cathode material, thereby improving performance and lifetime of the ion implantation apparatus. Gas mixtures according to the disclosure also result in a significant $Ge^+$ current gain (Continued)

and $W^+$ peak reduction during an ion implantation procedure.

13 Claims, 5 Drawing Sheets

(51) Int. Cl.
  *H01J 37/08* (2006.01)
  *H01J 37/317* (2006.01)
(52) U.S. Cl.
  CPC ... *H01J 2237/006* (2013.01); *H01J 2237/022* (2013.01)

(56) References Cited

U.S. PATENT DOCUMENTS

| | | |
|---|---|---|
| 2013/0072008 A1 | 3/2013 | Perel et al. |
| 2017/0292186 A1 | 10/2017 | Reinicker et al. |
| 2017/0330756 A1 | 11/2017 | Kaim et al. |

GERMANIUM TETRAFLOURIDE AND HYDROGEN MIXTURES FOR AN ION IMPLANTATION SYSTEM

CROSS-REFERENCE TO RELATED APPLICATION

This application is a 371 National Phase Entry Application of International Application No. PCT/US2019/022516, filed Mar. 15, 2019, which claims the benefit of U.S. Provisional Application No. 62/672,879, filed on May 17, 2018, which is hereby incorporated herein by reference in its entirety for all purposes.

TECHNICAL FIELD

The present disclosure relates to germanium tetrafluoride and hydrogen gas mixtures for enhanced lifetime and performance of components of an ion implantation system.

BACKGROUND

Ion implantation as practiced in semiconductor manufacturing involves deposition of a chemical species into a substrate, such as a microelectronic device wafer, by impingement of energetic ions of such species on the substrate. In order to generate the ionic implantation species, the dopant gas, which may for example be a halide or hydride of the dopant species, is subjected to ionization. This ionization is carried out using an ion source to generate an ion beam.

Once generated at the ion source, the ion beam is processed by extraction, magnetic filtering, acceleration/deceleration, analyzer magnet processing, collimation, scanning and magnetic correction to produce the final ion beam that is impinged on the substrate.

Various types of ion sources have been developed, including indirectly heated cathode ion sources, Freeman, Bernas, and various others, but regardless of the specific type of ion source employed, the ion source must be capable of continuous operation for extended periods of time, desirably without occurrence of system problems or impairments that would necessitate shut-down, maintenance or repair of the ion source. Accordingly, ion source lifetime is a critical characteristic of the ion implantation system, as regards to the efficient and cost-effective operation of the system.

Ion source failures are attributable to various causes, including accumulation of deposits on cathode surfaces that negatively affect thermionic emission of ions resulting in lowered arc currents, reduced performance and shortened lifetime of the ion source, as well as deleterious etching reactions from such dopant gases as germanium tetrafluoride as a result of the generation of free fluorine in the arc chamber, as well as stripping or sputtering of cathode material resulting in loss of physical integrity of the cathode and consequent reduction of performance and lifetime of the ion source.

In consequence of the need to avoid ion source failures, and to maintain the operating efficiency and lifetime of the ion source at high levels, the art is continually engaged in efforts to enhance lifetime and performance of ion sources in ion implantation systems.

SUMMARY

The current disclosure is directed to methods and assemblies that use germanium tetrafluoride ($GeF_4$) and hydrogen ($H_2$) gases in desired amounts to improve performance and lifetime of components of an ion implantation system. The methods and assemblies provide $GeF_4$ and $H_2$ in desired amounts relative to one another either as a pre-mixture or that are delivered separately to provide a mixture in an ion implantation chamber, wherein the relative amounts of $GeF_4$ and $H_2$ reduce undesirable accumulation of materials on the cathode or other source components that would otherwise impair function of the ion implantation system.

In one aspect, the disclosure is directed to a gas supply assembly for providing a gas mixture comprising germanium tetrafluoride ($GeF_4$) and hydrogen ($H_2$) gases in an ion implantation chamber. The gas supply assembly includes one or more fluid supply package(s) which include $GeF_4$ and $H_2$ gases. The gas supply assembly is configured to provide a gas mixture including $GeF_4$ and $H_2$ in an ion implantation chamber, wherein $H_2$ is present in an amount in the range of 25%-67% (volume) of the gas mixture, or the $GeF_4$ and $H_2$ gases are present in a volume ratio ($GeF_4$:$H_2$) in the range of 3:1 to 33:67.

The gas supply assembly can even be configured and operated to provide more specific amounts of $GeF_4$ and $H_2$ gases relative to one another, such as where $H_2$ is present in an amount in the range of 37%-67% of the gas mixture, or $GeF_4$ and $H_2$ are present in a volume ratio ($GeF_4$:$H_2$) in the range of 63:37 to 33:67.

The gas supply assembly can even be configured and operated to provide more specific amounts of $GeF_4$ and $H_2$ gases relative to one another, such as where $H_2$ is present in an amount in the range of 51-53% of the gas mixture, or $GeF_4$ and $H_2$ are present in a volume ratio ($GeF_4$:$H_2$) in the range of 49:51 to 47:53.

Embodiments of the gas supply assembly can be those wherein the $GeF_4$ and $H_2$ gases are present in mixture in a single gas supply unit (e.g., canister or tank), the mixture optionally including one or more other gases (e.g., inert gases). Embodiments of the gas supply assembly also include those where the $GeF_4$ and $H_2$ gases are present in separate gas supply units, with the assembly being configured to provide the $GeF_4$ and $H_2$ gases in the desired amounts according to the disclosure. For example, the gas supply assembly can optionally include flow circuitry configured to receive the $GeF_4$ and $H_2$ gases for mixing and dispensing to the ion implantation chamber so the gases are present in the desired amounts in the chamber following delivery.

In another aspect, the disclosure is directed to a method of implanting germanium in a substrate. The method includes a step of introducing $GeF_4$ and $H_2$ gases into an ion implantation chamber, wherein introducing provides a gas mixture comprising $GeF_4$ and $H_2$ in the ion implantation chamber, wherein $H_2$ is present in an amount in the range of 25%-67%, or $GeF_4$ and $H_2$ are present in a volume ratio ($GeF_4$:$H_2$) in the range of 3:1 to 33:67.

The method can be performed using desired operating conditions, such as desired beam currents, arc voltages, source beam current, gas flow rates, and pressures. In exemplary modes of practice and according to inventive studies associated with the disclosure, when the ion implantation apparatus includes a tungsten arc chambers, liners, filament and/or cathode which generates tungsten fluoride in the chamber during an ion implantation process, use of the $H_2$ gas in an amount in mixture or relative to the $GeF_4$ gas intercepts the tungsten-fluorine reaction and reduces tungsten fluoride formation. Further, using the desired amounts of $GeF_4$ and $H_2$ gases according to the disclosure resulted in a significant Ge⁺ current gain and W⁺ peak reduction during an ion implantation procedure.

In turn, this reduces the tungsten fluoride coating or deposition on cathode and other source components of the ion implantation apparatus, thereby improving function and significantly reducing the likelihood that the implantation procedure will be interrupted by an ion source failure.

Other aspects, features, and embodiments of the various novel and inventive subject matters of this disclosure will be more fully apparent from the ensuing description and appended claims.

DETAILED DESCRIPTION

The present disclosure relates generally to ion implantation equipment and processes, and more specifically to apparatus and methods for improving performance and lifetime of an ion implantation apparatus.

The current disclosure describes gas supply assemblies that provide germanium tetrafluoride ($GeF_4$) and hydrogen ($H_2$) gases in desired amounts to an ion implantation system. Further, the disclosure is related to methods for delivering $GeF_4$ and $H_2$ gases in desired amounts to an ion implantation system, such as to provide operational improvements during an ion implantation process. The disclosure also provides methods for ion implantation as well using the mixture of $GeF_4$ and $H_2$ gases, and an ion implantation system which includes the gas supply assembly in gaseous communication with one or more components of an ion implantation system.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the invention. The disclosure is set out herein in various embodiments, and with reference to various features and aspects of the invention. The disclosure contemplates such features, aspects and embodiments in various permutations and combinations, as being within the scope of the disclosure. The disclosure may therefore be specified as comprising, consisting or consisting essentially of, any of such combinations and permutations of these specific features, aspects and embodiments, or a selected one or ones thereof.

The compounds, compositions, features, steps and methods of the disclosure may be further specified in particular embodiments by provisos or limitations excluding specific substituents, isotopes, moieties, structures, ingredients, characteristics, steps or conditions, as applicable, in relation to various specifications and exemplifications thereof set forth herein. Unless noted otherwise, amounts of gas species are described in terms of volume.

The gas supply assemblies that provide $GeF_4$ and $H_2$ gases in desired amounts to an ion implantation system and methods of the current disclosure provide benefits for an ion implantation process over assemblies and processes that use amounts or types of gases that differ from what is encompassed by the current disclosure. The benefits may be understood by comparison of various gas mixtures and operating conditions according to the disclosure and as understood in the art.

In gas supply assemblies and methods of the disclosure, $GeF_4$ is used as a "dopant gas" which refers to a gas-phase material including the germanium dopant species, i.e., the species to be implanted in the ion implantation substrate. The fluorine of $GeF_4$ can be referred to as the non-dopant component of the $GeF_4$ dopant gas. In preferred aspects of the disclosure the dopant gas consists of $GeF_4$, or consists essentially of $GeF_4$ (i.e., where there is less than 1% volume of any other one or more dopant gas species that are different than $GeF_4$, as measured relative to the amount of $GeF_4$). In other aspects, $GeF_4$ can optionally be used with one or more other different dopant gas species, such as germane, boron trifluoride, diborane, silicon tetrafluoride, silane, phosphine, and arsine. If one or more different dopant gas species are used, $GeF_4$ is preferably the predominant gas species used in the system (i.e., used in an amount greater than any other optional dopant gas species), such as preferably greater than 50%, 60% or greater, 70% or greater, 80% or greater, 90% or greater, or 95% or greater of the total amount of dopant gas used in the gas supply assembly or associated method. If one or more optional dopant gas species are used in the supply assembly or associated method, the amount of $H_2$ used can be measured relative to the amount of $GeF_4$ gas.

e $GeF_4$ gas that is used can be based on a natural isotopic composition of Ge, or can be isotopically-enriched for certain Ge isotopes. Germanium has five naturally occurring isotopes that are $^{70}Ge$, $^{72}Ge$, $^{73}Ge$, $^{74}Ge$, and $^{76}Ge$, with $^{74}Ge$ being the most common germanium isotope, having a natural abundance of 36.28%. This is followed by $^2Ge$ having a natural abundance of 27.54%, $^{70}Ge$ having a natural abundance of 20.84%, $^{73}Ge$ having a natural abundance of 7.73%, and by $^{76}Ge$ having a natural abundance of 7.61%. In a preferred embodiment, the gas supply assemblies and methods of the disclosure use a natural isotopic distribution of Ge in the $GeF_4$ as the dopant gas.

In other embodiments isotopically-enriched $GeF_4$ gas can be used with $H_2$ in methods of the disclosure. For example, if an isotopically-enriched $GeF_4$ gas is used, the $GeF_4$ includes germanium isotopically enriched to above natural abundance level of at least one germanium isotope of $^{70}Ge$, $^{72}Ge$, $^{73}Ge$, $^{74}Ge$, and $^{76}Ge$. For example, an isotopically-enriched $GeF_4$ gas can include at least germanium isotopically enriched for the $^{72}Ge$ isotope, such as enriched to an amount greater than 50% of the total amount of germanium isotopes. As another example, an isotopically-enriched $GeF_4$ gas can include at least germanium isotopically enriched for the $^{72}Ge$ isotope, such as enriched to an amount greater than 50% of the total amount of germanium isotopes. Isotopically-enriched $GeF_4$ gases suitable for use in ion-implantation gas supply assemblies and methods of the disclosure are described in U.S. Pat. No. 8,237,134 (Kaim et al), the disclosure of which is incorporated herein by reference.

In gas supply assemblies and methods of the disclosure, $H_2$ is used as a "non-dopant gas" but which is effective when used with the $GeF_4$ gas to intercept the tungsten-fluorine reaction and reduce tungsten fluoride formation. Use of $H_2$ according to the disclosure can also provide other benefits such as improving $Ge^+$ current gain and $W^+$ peak reduction during an ion implantation procedure. In preferred aspects of the disclosure the non-dopant gas consists of $H_2$, or consists essentially of $H_2$ (i.e., where there is less than 1% volume of any other one or more non-dopant gas species that are different than $H_2$, as measured relative to the amount of $H_2$). In other aspects, $H_2$ can optionally be used with one or more other different non-dopant gas species. Such other non-dopant gas species can be described as "a diluent gas" or a "supplemental gas" or a "co-species gas." Examples of non-dopant gas species that are different than $H_2$ include helium, nitrogen, neon, argon, xenon, and krypton, which are also considered inert gases and not reactive with other compounds or materials associated with the gas supply assembly or ion implantation apparatus of the disclosure.

If one or more different non-dopant gas species are used, $H_2$ is preferably the predominant gas species used in the system (i.e., used in an amount greater than any other optional non-dopant gas species), such as preferably greater than 50%, 60% or greater, 70% or greater, 80% or greater, 90% or greater, or 95% or greater of the total amount of non-dopant gas species used in the gas supply assembly or associated method. If one or more optional non-dopant gas species are used in the supply assembly or associated method, the amount of $H_2$ used can be measured relative to the amount of $GeF_4$ gas.

Generally, the gas supply assembly is capable of providing a gas mixture including germanium tetrafluoride ($GeF_4$) and hydrogen ($H_2$) gases in an ion implantation chamber, wherein the $H_2$ is present in the mixture in an amount in the range of about 25% to about 67% (volume), or $GeF_4$ and $H_2$ are present in a volume ratio ($GeF_4$:$H_2$) in the range of about 3:1 to about 33:67. For example, in some embodiments, the gas supply assembly is capable of providing a gas mixture that consists of, or consists essentially of $GeF_4$ and $H_2$ (i.e., if any, less than 1% of one or more of non-$GeF_4$ or non-$H_2$ gas(es)). Therefore, the mixture can include a volume of $GeF_4$ in the range of about 33% to about 75%, and a volume of $H_2$ in the range of about 25% to about 67%. The gas supply assembly can be capable of providing a gas mixture that consists of, or consists essentially of $GeF_4$ and $H_2$ in any of the more specific amount or ratio ranges as described herein.

If one of more of a: dopant gas that is different than $GeF_4$, or a non-dopant gas that is different than $H_2$ is used with the $GeF_4$ and hydrogen $H_2$ gases, the relative amounts of $GeF_4$ and $H_2$ can remain within the ratio range as described herein. For example, if the gas supply assembly is capable of providing a gas mixture of about 90% of $GeF_4$ and $H_2$, the remaining 10% of gas(es) can be one or more of a dopant gas that is different than $GeF_4$, and/or a non-dopant gas that is different than $H_2$. Therefore, in such a scenario and by way of example, the mixture can include a volume of $GeF_4$ in the range of about 20% to about 60%, and a volume of $H_2$ in the range of about 30% to about 70%. In embodiments where different amounts of one or more of non-$GeF_4$ or non-$H_2$ gas(es) are used, other amount ranges of $GeF_4$ and $H_2$ can readily be determined in view of the guidance provided herein.

In a more specific embodiment, the gas supply assembly is capable of providing a gas mixture including $GeF_4$ and $H_2$ gases in an ion implantation chamber, wherein the $H_2$ is present in the mixture in an amount in the range of about 37% to about 67% (volume), or $GeF_4$ and $H_2$ are present in a volume ratio ($GeF_4$:$H_2$) in the range of about 63:37 to about 33:67.

In a more specific embodiment, the gas supply assembly is capable of providing a gas mixture including $GeF_4$ and $H_2$ gases in an ion implantation chamber, wherein the $H_2$ is present in the mixture in an amount in the range of about 42% to about 62% (volume), or $GeF_4$ and $H_2$ are present in a volume ratio ($GeF_4$:$H_2$) in the range of about 29:21 to about 19:31.

In a more specific embodiment, the gas supply assembly is capable of providing a gas mixture including $GeF_4$ and $H_2$ gases in an ion implantation chamber, wherein the $H_2$ is present in the mixture in an amount in the range of about 45% to about 59% (volume), or $GeF_4$ and $H_2$ are present in a volume ratio ($GeF_4$:$H_2$) in the range of about 11:9 to about 41:59.

In a more specific embodiment, the gas supply assembly is capable of providing a gas mixture including $GeF_4$ and hydrogen $H_2$ gases in an ion implantation chamber, wherein the $H_2$ is present in the mixture in an amount in the range of about 47% to about 57% (volume), or $GeF_4$ and $H_2$ are present in a volume ratio ($GeF_4$:$H_2$) in the range of about 53:47 to about 43:57.

In a more specific embodiment, the gas supply assembly is capable of providing a gas mixture including $GeF_4$ and $H_2$ gases in an ion implantation chamber, wherein the $H_2$ is present in the mixture in an amount in the range of about 49% to about 55% (volume), or $GeF_4$ and $H_2$ are present in a volume ratio ($GeF_4$:$H_2$) in the range of about 51:49 to about 9:11.

In a more specific embodiment, the gas supply assembly is capable of providing a gas mixture including $GeF_4$ and hydrogen $H_2$ gases in an ion implantation chamber, wherein the $H_2$ is present in the mixture in an amount in the range of about 51% to about 53% (volume), or $GeF_4$ and $H_2$ are present in a volume ratio ($GeF_4$:$H_2$) in the range of about 49:51 to about 47:53.

As discussed herein, in the gas supply assembly of the disclosure $GeF_4$ and $H_2$ can be mixed in a single fluid supply package, such as a single canister or tank. $GeF_4$ and $H_2$ can present in a single fluid supply package without any other gas present in the tank, in any of the ratio ranges described herein; can be can present in a single fluid supply package with very small amounts (less than 1%) of one or more other non-$GeF_4$ and non-$H_2$ gas(es); or can be present a single fluid supply package with one or more other non-$GeF_4$ and non-$H_2$ gas(es) in greater amounts, such as more than 1%, such as in the range of 1-20%, 1-10%, or 1-5%.

The gas supply assembly can be of any suitable type, and may for example comprise high-pressure gas cylinders, or internally pressure-regulated gas supply vessels, such as those commercially available from Entegris, Inc. (Billerica, Mass., USA) under the trademark VACV, or adsorbent-based gas supply vessels, such as those commercially available from Entegris, Inc. (Billerica, Mass., USA) under the trademark SDS®.

Using a single fluid supply package, $GeF_4$ and $H_2$ are arranged in the ion implantation system to be flowed to the ion source for supply thereof, wherein the $GeF_4$ gas and the $H_2$ gas are in mixture with one another.

Alternatively, in the gas supply assembly $GeF_4$ and $H_2$ can be present in separate fluid supply packages (e.g., such as canister or tank A and canister or tank B). If $GeF_4$ and $H_2$ are present in the assembly in separate fluid supply packages, the $GeF_4$ and $H_2$ can be in the packages in neat/pure form. Alternatively, the $GeF_4$ and $H_2$ fluid supply packages can including one or more other non-$GeF_4$ and non-$H_2$ gas(es) if desired.

If the $GeF_4$ and $H_2$ gases are be present in separate fluid supply packages the assembly can further includes flow circuitry configured to receive $GeF_4$ gas from the $GeF_4$-containing gas supply package and $H_2$ gas from the $H_2$-containing gas fluid supply package, for mixing thereof to form a mixture of $GeF_4$ and $H_2$ gases for dispensing to the ion implantation chamber. The flow circuitry can be configured to dispense the $GeF_4$ and $H_2$ gases so that when they are present in the ion implantation chamber in amounts in any of the ranges as described herein.

In various embodiments, the flow circuitry may include a mixing chamber arranged to receive the $GeF_4$ gas and the $H_2$ gas from their respective fluid supply packages, for mixing thereof to form the mixture of $GeF_4$ gas and $H_2$ gas for dispensing to the ion implantation chamber.

In various embodiments, the flow circuitry may include valving configured to selectively enable mixing of the $GeF_4$ gas and the $H_2$ gas in the mixing chamber, and alternatively to selectively enable the $GeF_4$ gas and the $H_2$ gas to be flowed separately to a chamber of the ion implantation apparatus. The valving can be configured to regulate the flow of the gases so the amount of $GeF_4$ gas and the $H_2$ gas are in any of the ranges as described herein.

In various embodiments, the flow circuitry may include a gas flow conduits such as tubing, wherein the conduit for the $H_2$ gas is larger than the conduit for the $GeF_4$ gas, wherein the larger sizing of the tubing permits a flow providing a greater volume of $H_2$ gas relative to the $GeF_4$ gas. As such, the sizing of the conduits can provide a flow of the gases so the amount of $GeF_4$ gas and the $H_2$ gas are in any of the ranges as described herein.

The flow circuitry can be configured to dispense the $GeF_4$ and $H_2$ gases so that when they are present in the ion implantation chamber, $GeF_4$ and $H_2$ are present in a volume ratio ($GeF_4$:$H_2$) in the range of about 1:3 to about 33:67, in the range of about 63:37 to 33:67, in the range of about 29:21 to about 19:31, in the range of about 11:9 to about 41:59, in the range of about 53:47 to about 43:57, in the range of about 51:49 to about 9:11, or in the range of about 49:51 to about 47:53.

In various embodiments, the gas supply assembly may comprise a processor configured to control dispensing of $GeF_4$ gas from the $GeF_4$-containing gas supply package and separate dispensing of $H_2$ gas from the $H_2$ gas supply package. In such assembly, the processor may be configured to control dispensing of $H_2$ gas so that $H_2$ gas is dispensed continuously during ion implantation, and the processor is configured to control dispensing of $GeF_4$ gas so that $GeF_4$ is dispensed intermittently during a dispensing of $H_2$ gas, or so that $GeF_4$ gas is dispensed sequentially after dispensing of $H_2$ gas. Using either continuous or intermittent dispensing, the processor can be configured to dispense the gases so the amount of $H_2$ and $GeF_4$ gases are in any of the ranges as described herein.

In some modes of practice, the $GeF_4$ gas and the $H_2$ gas are sequentially flowed to the ion source for ionization therein. Such sequential operation may be conducted in any suitable manner, utilizing equal time-based flows of the respective $GeF_4$ gas and the $H_2$ gas, or alternatively, the respective time-based flows may be different in respect of each other, or otherwise modulated to provide a doped substrate of desired character.

In various embodiments of the process, the $GeF_4$ gas and $H_2$ gas are flowed in mixture with one another to the ion source for generation of germanium dopant species for implantation. Other embodiments of the process are carried out in which the $GeF_4$ gas and $H_2$ gas are sequentially flowed to the ion source for generation of germanium dopant species for implantation.

The disclosure in another aspect relates to a method of improving performance and lifetime of an ion source arranged to generate a germanium ionic doping species for ion implantation from a $GeF_4$ feedstock. In one mode of practice, $GeF_4$ gas and $H_2$ gas are flowed in mixture with one another to the ion source for generation of germanium dopant species for implantation. In another embodiment of such method, $GeF_4$ gas and H2 gas are sequentially flowed to the ion source for generation of germanium dopant species for implantation.

The method can be performed using desired operating conditions, such as desired beam currents, arc voltages, source beam current, gas flow rates, and pressures. In exemplary modes of practice and according to inventive studies associated with the disclosure, when the ion implantation apparatus includes a tungsten filament which may generate one or more tungsten fluoride species ($WF_6$, $WF_5$, $WF_4$, $WF_3$, $WF_2$, WF) in the chamber during an ion implantation process, use of the $H_2$ gas in an amount in mixture or relative to the $GeF_4$ gas hinders formation of the tungsten fluoride species and reduces filament loss and accumulation of tungsten deposits.

In the gas supply assembly variously described above and in various method embodiments, the $H_2$ gas used in amounts described herein with the $GeF_4$ gas, and when present in mixture in the ion implantation chamber, intercepts the tungsten-fluorine reaction and reduces tungsten fluoride formation.

The result can be an effect which prevents material deposits from forming on surfaces of the arc chamber. For example, the $GeF_4$ and $H_2$ gas mixture used in amount described herein can be effective to prevent deposits at a wall surface of the arc chamber, at an insulator, or at other surfaces. A reduced presence of residue in the arc chamber can affect improved performance of the ion implantation system. As one example, residue present at insulators can reduce or prevent the occurrence of electrical failure by shorting that may be directly caused by residue build on the insulators.

Use of the $GeF_4$ and $H_2$ gas mixture used in amount described herein can also improve filament performance or filament lifetime. For example, using $H_2$ gas to prevent a tungsten-fluorine reaction can in turn reduce tungsten fluoride formation and prevent loss of arc chamber material. A result can be extended lifetime and improved ion implantation performance.

For example, during a period of operating the ion implantation system, a current or power is run through the filament and/or cathode while providing the implant chamber with a mixture of $GeF_4$ and $H_2$ used in amount described herein. If there is any loss or gain of filament or cathode material, such as could be determined by comparing the weight change of the filament or cathode before and after the operating period, the weight loss or gain is less than weight loss or gain of a filament over the same period and operating conditions, but without introducing the $H_2$ in amount described herein. For example, using $H_2$ gas in amounts relative to the $GeF_4$ gas, weight loss or gain can be of a filament or cathode can be reduced over the same period and operating conditions, but without using the $H_2$ in amount described herein.

The disclosure contemplates an ion implantation system that includes a gas supply assembly, as variously constituted.

In methods of the disclosure, the $H_2$ gas, alone, or mixed with the $GeF_4$ gas, can be flowed into the ion implantation chamber at one or more desired flow rates. The flow rate of a gas, or gas mixture, can be measured in flow units of standard cubic centimeters per minute (sccm). In method embodiments of the disclosure, the flow of $H_2$ gas introduced into the ion implantation chamber is at a flow rate of 0.2 sccm or greater. In more specific embodiments, $H_2$ gas is introduced into the ion implantation chamber at a flow rate in the range of 0.5 to 2 sccm, at a flow rate in the range of 0.75 to 1.75 sccm, or at a flow rate in the range of 1.0 to 1.5 sccm.

In methods of the disclosure, the $GeF_4$ gas, alone, or mixed with the $H_2$ gas, can be flowed into the ion implantation chamber at one or more desired flow rates. In method embodiments of the disclosure, the flow of $GeF_4$ gas introduced into the ion implantation chamber is at a flow rate of 0.2 sccm or greater. In more specific embodiments, inert $GeF_4$ is introduced into the ion implantation chamber at a flow rate in the range of 0.5 to 2 sccm, at a flow rate in the range of 0.75 to 1.75 sccm, or at a flow rate in the range of 1.0 to 1.5 sccm.

If the $GeF_4$ and $H_2$ are delivered to the ion implantation chamber from separate fluid supply packages, the flow rate for each gas can be adjusted to provide a $GeF_4/H_2$ mixture in amounts in any of the ranges of the disclosure. In embodiments, the $H_2$ gas is delivered from its fluid supply package at a rate that is greater than the rate of the $GeF_4$ gas delivery into the ion implantation chamber. For example, the flow rate of the $H_2$ gas can be up to 5%, up to 10%, up to 15%, up to 20%, up to 25%, up to 30%, up to 35%, up to 40%, up to 45%, up to 50%, up to 60%, or up to 70% greater than the flow rate of the $GeF_4$ gas.

In various modes of practice, the $GeF_4$ gas can be introduced to the ion implantation chamber intermittently in relation to flow of $H_2$ gas to the ion implantation chamber. In such embodiments, the intermittent flow of $GeF_4$ gas and the constant flow of $H_2$ gas can provide a $GeF_4/H_2$ mixture in amounts in any of the ranges of the disclosure. In various modes of practice, the $GeF_4$ gas can be introduced to the ion implantation chamber continuously in relation to flow of $H_2$ gas to the ion implantation chamber. In such embodiments, the continuous flow of $GeF_4$ and $H_2$ gases can provide a $GeF_4/H_2$ mixture in amounts in any of the ranges of the disclosure.

The disclosure contemplates a method of operating an ion implantation system to increase operating life between maintenance events, wherein the method includes providing a $GeF_4/H_2$ mixture in amounts in any of the ranges of the disclosure, while operating the ion implantation system to deposit germanium in a substrate.

Various ion implantation system operating conditions can be used in conjunction with the flow of $GeF_4$ and $H_2$ gases into the chamber of the ion implantation system. In methods of operating the ion implantation system while introducing the $GeF_4$ and $H_2$ gases, the beam current can be of greater than about 0.5 mA, such as a beam current in the range of about 1 to about 3 mA, a beam current in the range of about 3 to about 5 mA, a beam current in the range of about 5 to about 7 mA, a beam current in the range of about 7 to about 10 mA, or even a beam current of greater than 10 mA.

In modes of practice a beam current in any of the recited ranges is provided at an arc voltage in the range of 30V to 150V and a source beam of 5 mA to 80 mA. In one exemplary mode of operation using the ion implantation system, a beam current in any of the recited ranges is provided at an arc voltage of 90V and a source beam of 30 mA.

Figure 1:
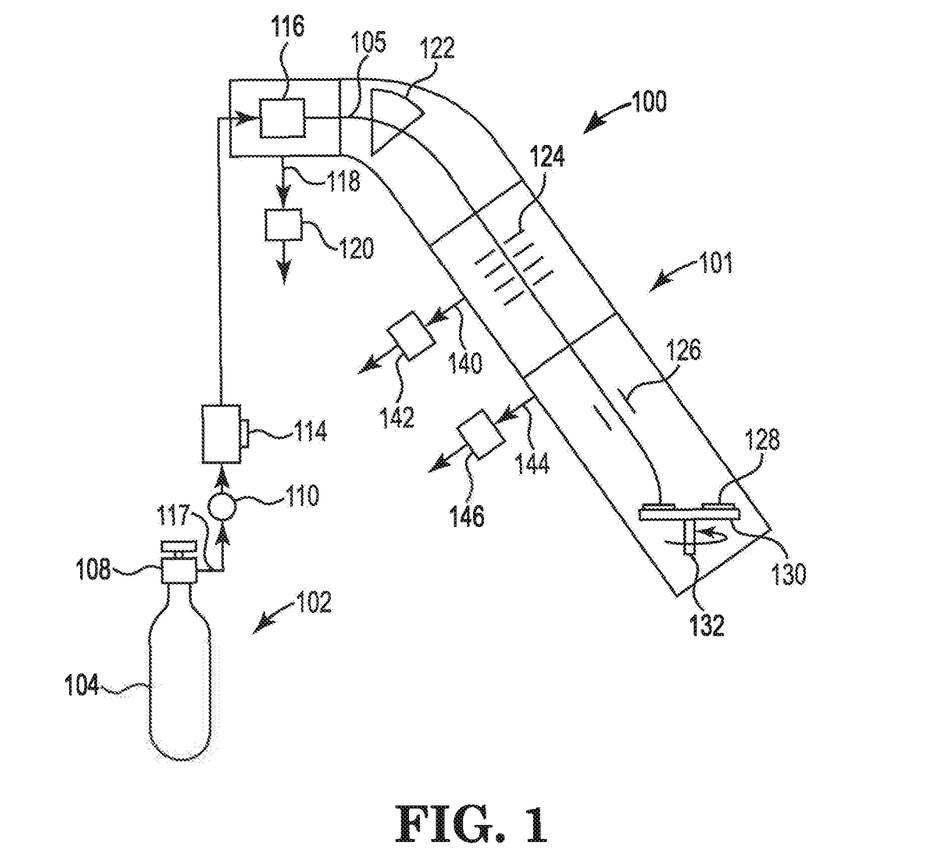
FIG. 1 is a schematic representation of a gas supply assembly with a single fluid supply package and associated ion implantation apparatus according to one aspect of the disclosure.

Referring now to the drawings, FIG. 1 is a schematic representation of an ion implant process system with a gas supply assembly according to one aspect of the disclosure The ion implant process system 100 includes a storage and dispensing vessel 102 containing having an interior volume holding a mixture of the $GeF_4$ and $H_2$ gases in amounts in any of the ranges of the disclosure that is supplied for ion implantation doping of a substrate 128 in the illustrated ion implant chamber 301. The storage and dispensing vessel may be of a type containing a sorbent medium on which the dopant gas is physically adsorbed for storage of the gas, with the gas being desorbed from the sorbent medium, under dispensing conditions, for discharge from the vessel. The sorbent medium may be a solid-phase carbon adsorbent material. Sorbent-based vessels of such type are commercially available from Entegris. Inc. (Danbury, Conn., USA) under the trademarks SDS and SAGE. Alternatively, the vessel may be of an internally pressure-regulated type, containing one or more pressure regulators in the interior volume of the vessel. Such pressure-regulated vessels are commercially available from Entegris, Inc. (Danbury, Conn., USA) under the trademark VAC. As a still further alternative, the vessel may contain the dopant source material in a solid form that is volatilized, e.g., by heating of the vessel and/or its contents, to generate the dopant gas as a vaporization or sublimation product. Solid delivery vessels of such type are commercially available from Entegris, Inc. (Danbury, Conn., USA) under the trademark ProEvap.

In FIG. 1, the storage and dispensing vessel 102 comprises a cylindrical vessel wall 104 enclosing an interior volume holding the mixture of the $GeF_4$ and $H_2$ gases in an adsorbed state, a free gas state, or a liquefied gas state, or a mixture thereof.

The storage and dispensing vessel 102 includes a valve head 108 coupled in gas flow communication via a dispensing line 117. A pressure sensor 110 may be disposed in the line 117, together with a mass flow controller 114; other optional monitoring and sensing components may be coupled with the line, and interfaced with control means such as actuators, feedback and computer control systems, cycle timers, etc.

In the illustrated system 100, the ion implant chamber 101 contains an ion source 116 receiving the dispensed mixture of the $GeF_4$ and $H_2$ gases from line 117 and generates an ion beam 105. The ion beam 105 passes through the mass analyzer unit 122 which selects the ions needed and rejects the non-selected ions.

The selected ions pass through the acceleration electrode array 124 and then the deflection electrodes 126. The resulting focused ion beam is impinged on the substrate element 128 disposed on the rotatable holder 130 mounted on spindle 132. The ion beam of dopant ions is used to dope the substrate as desired to form a doped structure.

The respective sections of the ion implant chamber 101 are exhausted through lines 118, 140 and 144 by means of pumps 120, 142 and 146, respectively.

Figure 2:
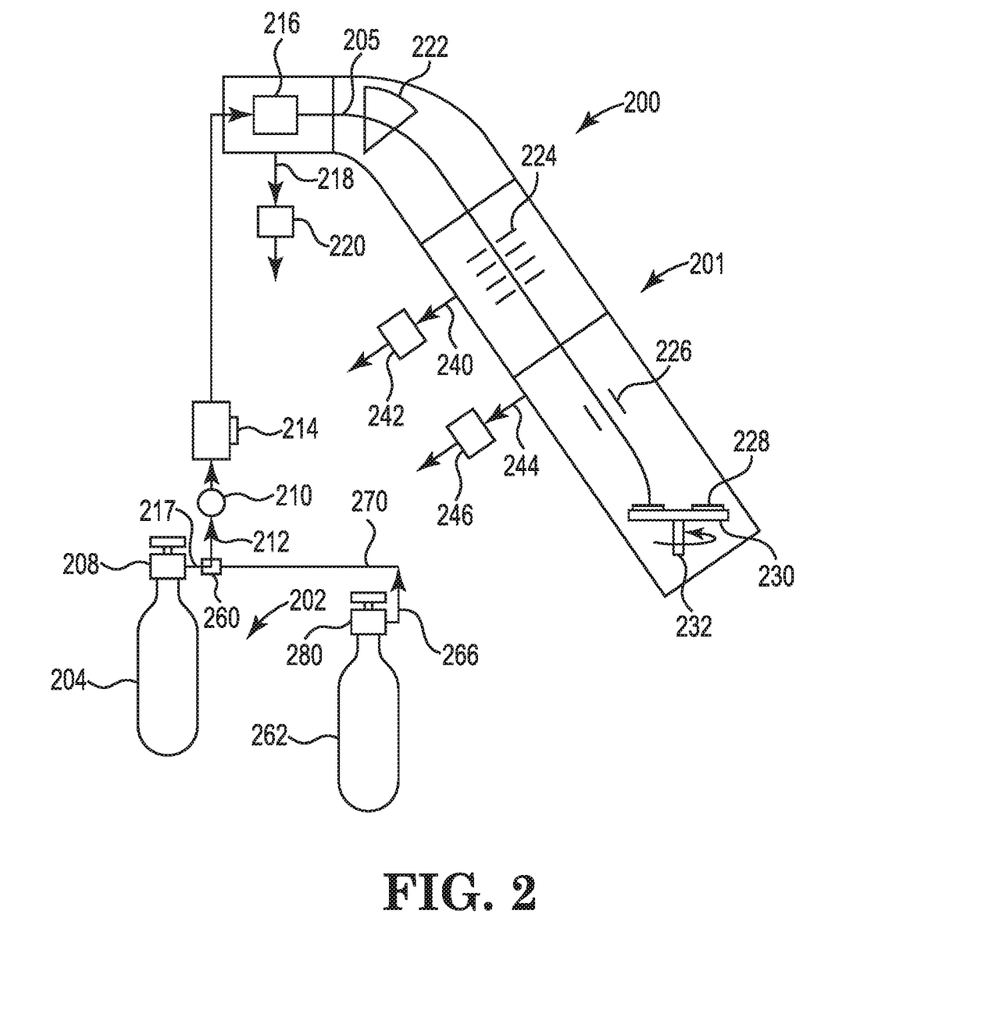
FIG. 2 is a schematic representation of a gas supply assembly with multiple fluid supply packages and associated ion implantation apparatus according to another aspect of the disclosure.

FIG. 2 is a schematic representation of an ion implant process system according to another aspect of the disclosure, wherein the $GeF_4$ and $H_2$ gases are dispensed from separate fluid supply units. In FIG. 2, the storage and dispensing vessel 202 comprises a cylindrical vessel wall 204 enclosing an interior volume holding the $GeF_4$ gas in an adsorbed state, a free gas state, or a liquefied gas state.

The storage and dispensing vessel 202 includes a valve head 208 coupled in gas flow communication via a dispensing line 217 with a mixing chamber 260 (which is optional), joined in turn to discharge line 212. A pressure sensor 210 may be disposed in the line 212, together with a mass flow controller 214; other optional monitoring and sensing components may be coupled with the line, and interfaced with control means such as actuators, feedback and computer control systems, cycle timers, etc.

The mixing chamber 260 also if used may be joined in flow communication with gas feed line 270, to which are coupled $H_2$ gas supply vessel 262. Vessel 262 includes at least the $H_2$ gas, and optionally contains a non-$H_2$ gas, such as an inert gas.

Vessel 262 is formed with a main container portion to which is secured a valve head 280 that is in turn coupled with supplemental vessel feed line 266. Feed line 266 by such arrangement delivers the $H_2$ gas to the mixing chamber 260, to provide a gas mixture containing the $GeF_4$ and $H_2$ gases, for passage to the ion source of the implanter. For such purpose, the vessel feed line 266, and dispensing line 217 may be equipped with suitable valves, controllers and/or sensors for manually or automatically controlling the flow or other characteristics of the materials dispensed from the vessels and such valves, controllers and/or sensors can be coupled with or connected to the corresponding feed/dispensing lines in any suitable manner.

Such valves may in turn be coupled with valve actuators operatively linked to a central processor unit (CPU). The CPU may be coupled in signal communication relationship with the aforementioned controllers and/or sensors, and programmably arranged to control the rates, conditions and amounts of fluids dispensed from each of the vessels in relation to each other, so that the $GeF_4$ and $H_2$ gas mixture flowed from the mixing chamber 260 in line 212 has a desired composition, temperature, pressure and flow rate for carrying out the ion implantation operation.

In the illustrated system 200, the ion implant chamber 201 contains an ion source 216 receiving the dispensed $GeF_4$ and $H_2$ gas mixture from line 212 and generates an ion beam 205. The ion beam 205 passes through the mass analyzer unit 222 which selects the ions needed and rejects the non-selected ions.

The selected ions pass through the acceleration electrode array 224 and then the deflection electrodes 226. The resulting focused ion beam is impinged on the substrate element 228 disposed on the rotatable holder 230 mounted on spindle 232. The ion beam of dopant ions is used to dope the substrate as desired to form a doped structure.

The respective sections of the ion implant chamber 201 are exhausted through lines 218, 240 and 244 by means of pumps 220, 242 and 246, respectively.

Finally, it will be appreciated that the utilization of $GeF_4$ and $H_2$ gas mixture in the ion implantation system operation as herein variously disclosed, achieves a substantial advance in the art, in enabling the operating life of the ion implantation system to be substantially increased, and the overall efficiency of the ion implantation system to be enhanced.

EXAMPLES

Example 1

Ion Implantation Using $GeF_4/H_2$ Mixture (Beam Current)

Figure 3:
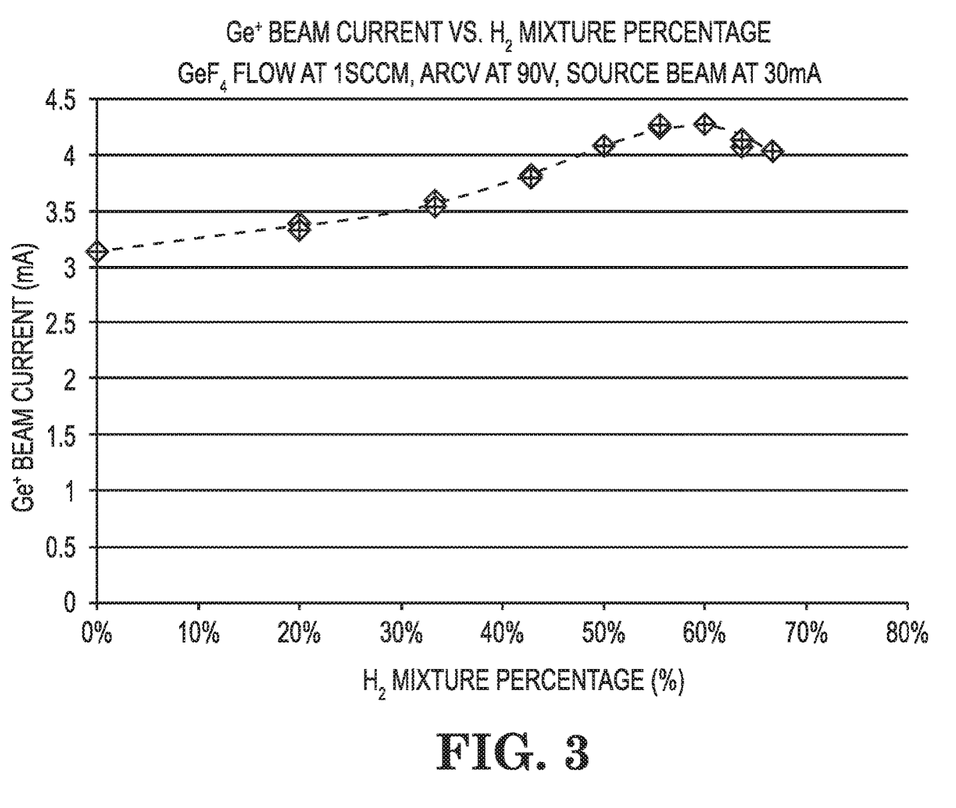
FIG. 3 is a graph showing changes in beam current as various $H_2$ mixture percentages in an ion implantation process using a constant flow of $GeF_4$.

An ion implantation apparatus with the following features: An implant test stand with indirectly heated cathode (IHC) source with tungsten arc chamber and liners was operated at an arc voltage (ArcV) at 90V. and a source beam at 30 mA. $GeF_4$ flow into the implantation chamber was held constant rate of 1 sccm. The mixture of $H_2$ into the chamber varied from 0% to 67%. Beam current was measured as the mixture percentage of $H_2$ into the chamber changed. Results are shown in FIG. 3.

Example 2

Ion Implantation Using $GeF_4/H_2$ Mixture (Cathode Weight Change)

Figure 4:
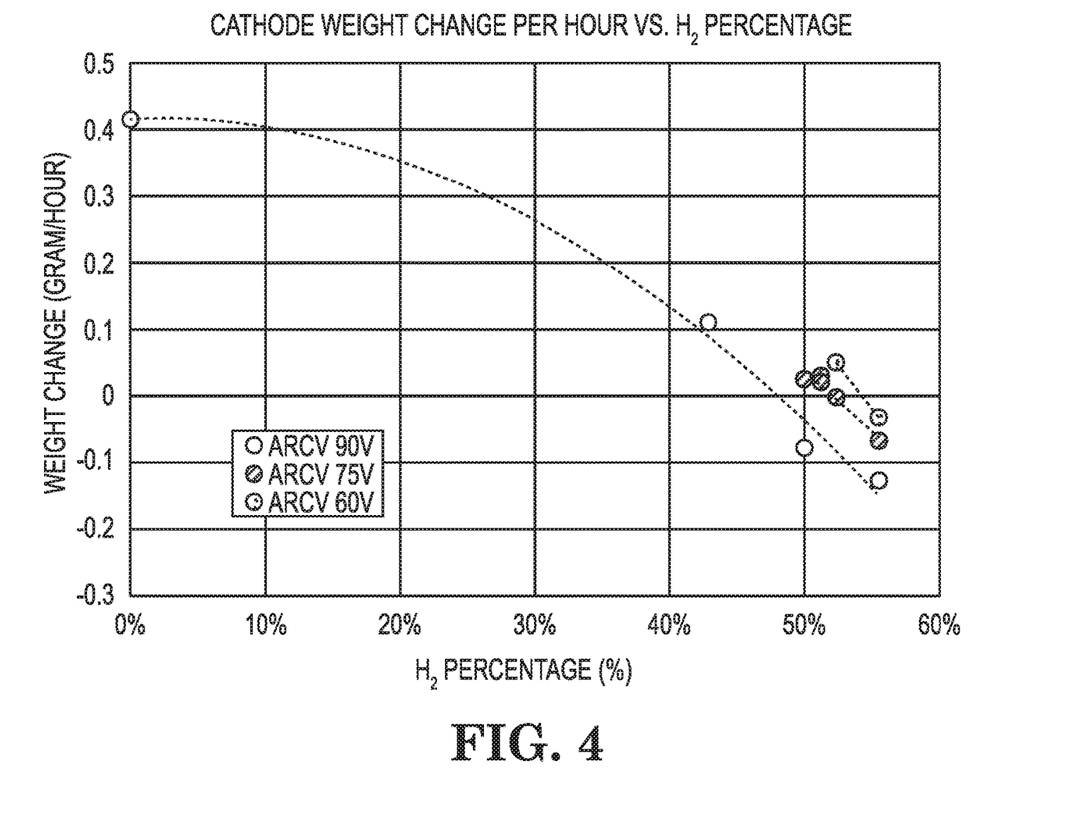
FIG. 4 is a graph showing rates of cathode weight change at various $H_2$ mixture percentages in an ion implantation process using a constant flow of $GeF_4$ and various arc voltages.

An ion implantation apparatus according to Example 1 was operated at various arc voltages (ArcV) at 90V, 75V, and 60V, and a source beam at 30 mA. $GeF_4$ flow into the implantation chamber was held constant rate of 1 sccm. The mixture of $H_2$ percentage into the chamber varied from 0% to 56%. The rate of weight change of the cathode (gram/hour) was measured after a run period. Results are shown in FIG. 4.

Example 3

Ion Implantation Using $GeF_4/H_2$ Mixture (Beam Spectrum Analysis)

Figure 5:
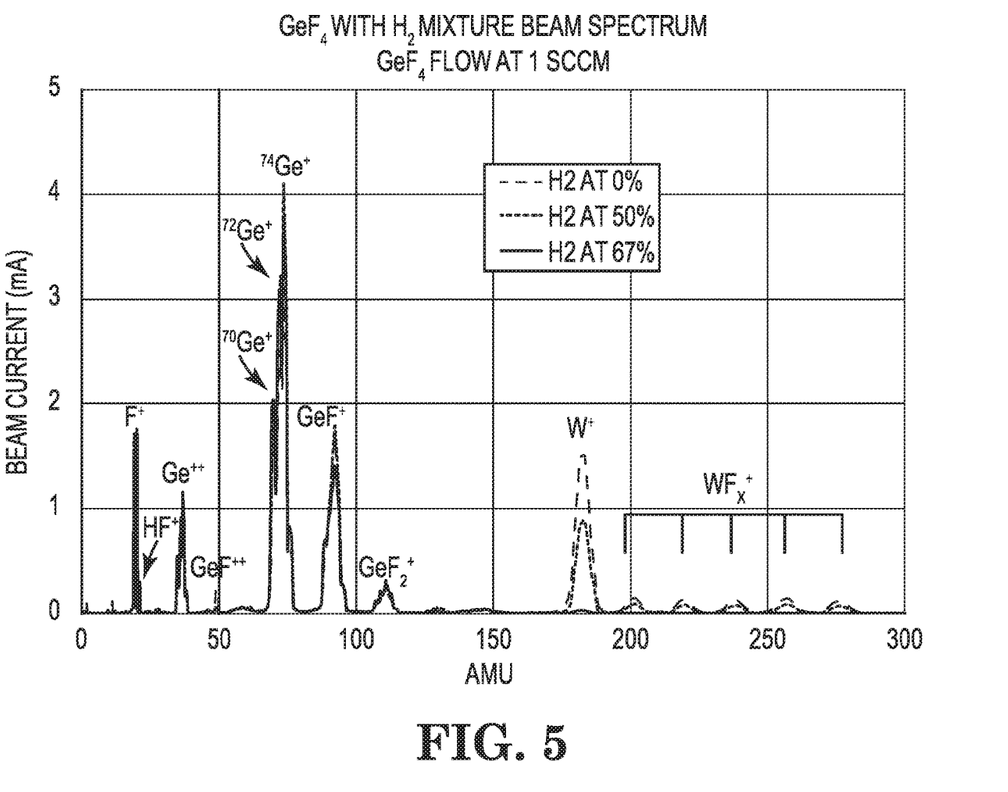
FIG. 5 is a graph showing AMU beam spectrum analysis of changes in beam current for various ionic species generated in an ion implantation process using a constant flow of $GeF_4$ and various $H_2$ mixture percentages.

An ion implantation apparatus according to Example 1 was operated at an arc voltage of 90V, and a source beam at 30 mA. $GeF_4$ flow into the implantation chamber was held constant rate of 1 sccm. The mixture of $H_2$ percentage into the chamber was varied at 0%, 50%, and 67%. AMU beam spectrum analysis was performed allowing comparison of changes in beam current for various ionic species. Results are shown in FIG. 5.

ASPECTS

Aspect 1. A first gas supply assembly for providing a gas mixture comprising germanium tetrafluoride ($GeF_4$) and hydrogen ($H_2$) gases in an ion implantation chamber comprising: one or more fluid supply package(s) comprising $GeF_4$ and $H_2$ wherein the assembly is configured to provide a gas mixture comprising $GeF_4$ and $H_2$ an ion implantation chamber, wherein $H_2$ is present in an amount in the range of 25%-67% (volume) of the gas mixture, or $GeF_4$ and $H_2$ are present in a volume ratio ($GeF_4:H_2$) in the range of 3:1 to 33:67.

Aspect 2. The gas supply assembly of aspect 1, wherein $H_2$ is present in an amount in the range of 37-67% of the gas mixture, or $GeF_4$ and $H_2$ are present in a volume ratio ($GeF_4:H_2$) in the range of 63:37 to 33:67.

Aspect 3. The gas supply assembly of aspect 1, wherein $H_2$ is present in an amount in the range of 42-62% of the gas mixture, or $GeF_4$ and $H_2$ are present in a volume ratio ($GeF_4:H_2$) in the range of 29:21 to 19:31.

Aspect 4. The gas supply assembly of aspect 1, wherein $H_2$ is present in an amount in the range of 45-59% of the gas mixture, or $GeF_4$ and $H_2$ are present in a volume ratio ($GeF_4:H_2$) in the range of 11:9 to 41:59

Aspect 5. The gas supply assembly of aspect 1, wherein $H_2$ is present in an amount in the range of 47-57% of the gas mixture, or $GeF_4$ and $H_2$ are present in a volume ratio $(GeF_4:H_2)$ in the range of 53:47 to 43:57.

Aspect 6. The gas supply assembly of aspect 1, wherein $H_2$ is present in an amount in the range of 49-55% of the gas mixture, or $GeF_4$ and $H_2$ are present in a volume ratio $(GeF_4:H_2)$ in the range of 51:49 to 9:11.

Aspect 7. The gas supply assembly of aspect 1, wherein $H_2$ is present in an amount in the range of 51-53% of the gas mixture, or $GeF_4$ and $H_2$ are present in a volume ratio $(GeF_4:H_2)$ in the range of 49:51 to 47:53.

Aspect 8. The gas supply assembly of any of the previous aspects wherein the gases consist essentially of $GeF_4$ and $H_2$.

Aspect 9. The gas supply assembly of any of aspects 1-7 further comprising an inert gas selected from the group consisting of argon, helium, neon, nitrogen, xenon, and krypton.

Aspect 10. The gas supply assembly of any of the previous aspects, wherein $GeF_4$ and $H_2$ are mixed in a single fluid supply package.

Aspect 11. The gas supply assembly of any of aspects 1-9, wherein $GeF_4$ is present in a $GeF_4$-containing gas supply package and $H_2$ is present in a separate $H_2$-containing gas supply package.

Aspect 12. The gas supply assembly of aspect 11, wherein the assembly further comprises flow circuitry configured to receive $GeF_4$ from the $GeF_4$-containing gas supply package and $H_2$ from the $H_2$-containing gas supply package, for mixing thereof to form a mixture of $GeF_4$ and $H_2$ for dispensing to the ion implantation chamber.

Aspect 13. The gas supply assembly of aspect 12, wherein the flow circuitry comprises (i) a mixing chamber arranged to receive the $GeF_4$ and $H_2$ from their respective fluid supply packages, for mixing thereof to form the mixture of $GeF_4$ and $H_2$ for dispensing to the ion implantation chamber, or (ii) valving configured to selectively enable mixing of the $GeF_4$ and $H_2$ in a mixing chamber, and alternatively to selectively enable the $GeF_4$ and $H_2$ to be flowed separately to the ion implantation chamber.

Aspect 14. The gas supply assembly of aspect 11, further comprising a processor configured to control dispensing of $GeF_4$ and $H_2$ from their respective fluid supply packages.

Aspect 15. The gas supply assembly of aspect 14, wherein the processor is configured to control dispensing of $H_2$ so it is dispensed continuously during ion implantation, and the processor is configured to control dispensing of $GeF_4$ so that it is dispensed intermittently during a dispensing of inert gas, or so that $GeF_4$ is dispensed sequentially after dispensing of $H_2$.

Aspect 16. The gas supply assembly of any of the previous aspects, wherein $GeF_4$ is not isotopically enriched.

Aspect 17. An ion implantation system comprising the gas supply assembly of any of aspects 1-16.

Aspect 18. The ion implantation system of aspect 17 comprising a tungsten-containing filament.

Aspect 19. A method of implanting germanium in a substrate, comprising introducing germanium tetrafluoride $(GeF_4)$ and hydrogen $(H_2)$ gases into an ion implantation chamber comprising, wherein introducing provides a gas mixture comprising $GeF_4$ and $H_2$ an ion implantation chamber, wherein $H_2$ is present in an amount in the range of 25%-67%, or $GeF_4$ and $H_2$ are present in a volume ratio $(GeF_4:H_2)$ in the range of 3:1 to 33:67.

Aspect 20. The method of aspect 19, wherein the method provides a beam current of greater than 0.5 mA.

Aspect 21. The method of aspect 19 wherein the method provides a beam current of greater than 1-3 mA.

Aspect 22. The method of aspect 19 wherein the method provides a beam current in the range of greater than 3-5 mA.

Aspect 23. The method of aspect 19 wherein the method provides a beam current of greater than 5-7 mA.

Aspect 24. The method of aspect 19 wherein the method provides a beam current of greater than 7-10 mA.

Aspect 25. The method of any one of aspects 20 to 24, wherein the beam current in is provided at an arc voltage of 90V and a source beam of 30 mA.

Aspect 26. The method of any one of aspects 20 to 24, wherein the beam current in is provided at an arc voltage of 30V to 150V and a source beam of 5 mA to 80 mA.

Aspect 27. The method of aspect 19, wherein $H_2$ is flowed into the ion implantation chamber at a rate of 0.2 sccm or greater.

Aspect 28. The method of aspect 27, wherein $H_2$ is flowed into the ion implantation chamber at a rate in the range of 0.5-2.0 sccm.

Aspect 29. The method of aspect 19, wherein $GeF_4$ is flowed into the ion implantation chamber at a rate of 0.2 sccm or greater.

Aspect 30. The method of aspect 29, wherein $GeF_4$ is flowed into the ion implantation chamber at a rate in the range of 0.5-2.0 sccm.

Aspect 31. The method of any of aspects 19-30, wherein $GeF_4$ and $H_2$ are separately flowed into the ion implantation chamber.

Aspect 32. The method of any of aspects 19-30 wherein $GeF_4$ and $H_2$ are mixed in a single fluid supply package.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A gas supply assembly for providing a gas mixture comprising germanium tetrafluoride $(GeF_4)$ and hydrogen $(H_2)$ gases in an ion implantation chamber comprising:
one or more fluid supply package(s) comprising $GeF_4$ and $H_2$ wherein the assembly is configured to provide a gas mixture comprising $GeF_4$ and $H_2$ an ion implantation chamber, wherein $H_2$ is present in an amount in the range of 25%-67% (volume) of the gas mixture, or $GeF_4$ and $H_2$ are present in a volume ratio $(GeF_4:H_2)$ in the range of 3:1 to 33:67.

2. The gas supply assembly of claim 1 wherein $H_2$ is present in an amount in the range of 37-67% of the gas mixture, or $GeF_4$ and $H_2$ are present in a volume ratio $(GeF_4:H_2)$ in the range of 63:37 to 33:67.

3. The gas supply assembly of claim 1 wherein $H_2$ is present in an amount in the range of 42-62% of the gas mixture, or $GeF_4$ and $H_2$ are present in a volume ratio $(GeF_4:H_2)$ in the range of 29:21 to 19:31.

4. The gas supply assembly of claim 1 wherein $H_2$ is present in an amount in the range of 45-59% of the gas mixture, or $GeF_4$ and $H_2$ are present in a volume ratio $(GeF_4:H_2)$ in the range of 11:9 to 41:59.

5. The gas supply assembly of claim 1 wherein $H_2$ is present in an amount in the range of 47-57% of the gas mixture, or $GeF_4$ and $H_2$ are present in a volume ratio $(GeF_4:H_2)$ in the range of 53:47 to 43:57.

6. The gas supply assembly of claim 1 wherein $H_2$ is present in an amount in the range of 49-55% of the gas mixture, or $GeF_4$ and $H_2$ are present in a volume ratio ($GeF_4:H_2$) in the range of 51:49 to 9:11.

7. The gas supply assembly of claim 1 wherein $H_2$ is present in an amount in the range of 51-53% of the gas mixture, or $GeF_4$ and $H_2$ are present in a volume ratio ($GeF_4:H_2$) in the range of 49:51 to 47:53.

8. The gas supply assembly of claim 1, wherein the gases consist essentially of $GeF_4$ and $H_2$.

9. The gas supply assembly of claim 1, further comprising an inert gas selected from the group consisting of argon, helium, neon, nitrogen, xenon, and krypton.

10. The gas supply assembly of claim 1, wherein $GeF_4$ and $H_2$ are mixed in a single fluid supply package.

11. The gas supply assembly of claim 1, wherein $GeF_4$ is present in a $GeF_4$-containing gas supply package and $H_2$ is present in a separate $H_2$-containing gas supply package.

12. The gas supply assembly of claim 1, wherein $GeF_4$ is not isotopically enriched.

13. A method of implanting germanium in a substrate, comprising introducing germanium tetrafluoride ($GeF_4$) and hydrogen ($H_2$) gases into an ion implantation chamber comprising, wherein introducing provides a gas mixture comprising $GeF_4$ and $H_2$ an ion implantation chamber, wherein $H_2$ is present in an amount in the range of 25%-67%, or $GeF_4$ and $H_2$ are present in a volume ratio ($GeF_4:H_2$) in the range of 3:1 to 33:67.

* * * * *